United States Patent
Hagura et al.

(10) Patent No.: US 6,693,838 B2
(45) Date of Patent: Feb. 17, 2004

(54) SEMICONDUCTOR MEMORY DEVICE EQUIPPED WITH REFRESH TIMING SIGNAL GENERATOR

(75) Inventors: Tsukasa Hagura, Tokyo (JP); Takafumi Takatsuka, Tokyo (JP); Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/267,753

(22) Filed: Oct. 10, 2002

(65) Prior Publication Data
US 2003/0198117 A1 Oct. 23, 2003

(30) Foreign Application Priority Data
Apr. 15, 2002 (JP) .................................... P2002-111953

(51) Int. Cl.[7] ................................................. G11C 7/00
(52) U.S. Cl. ................................ 365/222; 365/230.03
(58) Field of Search ............................. 365/222, 230.03

(56) References Cited

U.S. PATENT DOCUMENTS 5,243,576 A * 9/1993 Ishikawa ..................... 365/222
5,862,093 A * 1/1999 Sakakibara .................. 365/222
6,493,281 B2 * 12/2002 Mizugaki ..................... 365/222
6,542,425 B2 * 4/2003 Nam ........................... 365/222

FOREIGN PATENT DOCUMENTS

| JP | 2001-43677 | * 2/2001 |
| WO | 96/28825 | * 9/1996 |

* cited by examiner

*Primary Examiner*—Son Mai
(74) *Attorney, Agent, or Firm*—McDermott, Will & Emery

(57) ABSTRACT

A semiconductor memory device such as a pseudo SRAM or the like is provided with a memory cell array being refreshed in accordance with a refresh timing signal having a predetermined refresh period and generated by a refresh timing signal generator circuit. A selector selects a block to hold data in the memory cell array divided into a plurality of blocks in accordance with a predetermined command signal, and a signal generator changes the refresh period according to a number of blocks selected by said selecting means, and generates a refresh timing signal having a changed refresh period and outputs a generated refresh signal.

5 Claims, 6 Drawing Sheets

FIRST PREFERRED EMBODIMENT
REFRESH TIMING SIGNAL GENERATOR CIRCUIT 152-1

FIRST PREFERRED EMBODIMENT

Fig.2 FIRST PREFERRED EMBODIMENT
REFRESH TIMING SIGNAL GENERATOR CIRCUIT 152-1

SECOND PREFERRED EMBODIMENT
REFRESH TIMING SIGNAL GENERATOR CIRCUIT 152-2

THIRD PREFERRED EMBODIMENT
REFRESH TIMING SIGNAL GENERATOR CIRCUIT 152-3

FOURTH PREFERRED EMBODIMENT
REFRESH TIMING SIGNAL GENERATOR CIRCUIT 152-4

REFRESH TIMING SIGNAL GENERATOR CIRCUIT 152-5

SEMICONDUCTOR MEMORY DEVICE EQUIPPED WITH REFRESH TIMING SIGNAL GENERATOR

BACKGROUND OF THE INVENTION

1. Field of the Invention

The present invention relates to a semiconductor memory device such as a pseudo static random access memory (Pseudo SRAM) or the like, and in particular, to a semiconductor memory device having a function capable of selecting a block to hold data in a memory array divided into a plurality of blocks.

2. Description of the Prior Art

FIG. 6 is a circuit diagram showing a construction of a refresh timing signal generator circuit 152-5 of a prior art example. The refresh timing signal generator circuit 152-5 of FIG. 6 is provided for hidden refresh executed by itself for a semiconductor memory device that is the so-called "Pseudo SRAM", which is provided with DRAM type memory cells and has an input and output interface compatible with the asynchronous type SRAM.

The refresh timing signal generator circuit 152-5 of FIG. 6 is provided with a reference voltage generator circuit 1 for generating a reference voltage VN and a ring oscillator 2 for generating a refresh timing signal φ of a predetermined period in accordance with the reference voltage VN generated as described above.

In the reference voltage generator circuit 1 of FIG. 6, a supply line Vdd of a power voltage is connected to a drain of a P-channel field-effect transistor (hereinafter referred to as a P-channel FET) P1, and a source thereof is connected to the gate thereof and is connected to the source of a drain-grounded N-channel field-effect transistor (hereinafter referred to as an N-channel FET) N1, and the gate of a P-channel FET P2. Moreover, the supply line Vdd of the power voltage is connected to the drain of the P-channel FET P2 via a resistor R1, and the source thereof is connected to a source and a gate of a drain-grounded N-channel FET N2 and the gate of the N-channel FET N1. In the reference voltage generator circuit 1 constructed as above, at the connection point of the source of the P-channel FET P2 and the source of the N-channel FET N2, a predetermined reference voltage VN based on the power voltage Vdd is generated so as to be supplied to a ring oscillator 2.

In the ring oscillator 2 of FIG. 6, the reference voltage VN from the reference voltage generator circuit 1 is inputted to the gates of five N-channel FETs N4, N6, N8, N10 and N12. A CMOS type inverter IN1 constructed of a P-channel FET P3 and an N-channel FET N3, and an N-channel FET N4 that is connected to the grounded side of the N-channel FET N3 and is controlled by the reference voltage VN constitute an inverter AP1 provided with an amplification function. Likewise, a CMOS type inverter IN2 constructed of a P-channel FET P4 and an N-channel FET N5, and an N-channel FET N6 that is connected to the grounded side of the N-channel FET N5 and is controlled by the reference voltage VN constitute an inverter AP2 provided with an amplification function. Further, a CMOS type inverter IN3 constructed of a P-channel FET P5 and an N-channel FET N7, and an N-channel FET N8 that is connected to the grounded side of the N-channel FET N7 and is controlled by the reference voltage VN constitute an inverter AP3 provided with an amplification function. Yet further, a CMOS type inverter IN3 constructed of a P-channel FET P6 and an N-channel FET N9, and an N-channel FET N10 that is connected to the grounded side of the N-channel FET N9 and is controlled by the reference voltage VN constitute an inverter AP4 provided with an amplification function. Yet further, a CMOS type inverter IN5 constructed of a P-channel FET P7 and an N-channel FET N11, and an N-channel FET N12 that is connected to the grounded side of the N-channel FET N11 and is controlled by the reference voltage VN constitute an inverter AP5 provided with an amplification function. These five-stage inverters AP1 to AP5 each provided with the amplification function are connected in series, and an output signal from the inverter AP5 provided with the amplification function is negatively fed back to the input of the first-stage inverter AP1 provided with the amplification function, constituting an oscillator circuit. In the ring oscillator 2 constructed as above, a refresh timing signal φ having a predetermined period is generated in accordance with the inputted reference voltage VN and outputted.

In the refresh timing signal generator circuit 152-5 constructed as above, the refresh period, i.e., the oscillation frequency of the ring oscillator 2 is determined by the voltage level of the reference voltage VN and the number of stages (five stages in the construction of FIG. 6) of the inverters, which are each provided with the amplification function and constitute the ring oscillator. Therefore, the refresh period is constant regardless of the operation mode. Normally, the refresh period is set so as to become equal to or greater than a value obtained by dividing the refresh standard by the number of cycles for refreshing all the memory cells. For example, if the standard of the refresh period is 300 msec and the number of cycles is 8192, then the refresh period is set to 300 msec/8192=36 μsec.

In a semiconductor memory device that has a function capable of making an entry into a mode capable of selecting the block to hold data in the memory array divided into a plurality of blocks by means of an address key or the like (the function being hereinafter referred to as a data-hold block selection function), there has been a growing demand for suppressing the consumption of current when the number of blocks to hold data is small.

SUMMARY OF THE INVENTION

An essential object of the present invention is to solve the aforementioned problems and provide a semiconductor memory device capable of reducing the consumption of power in the case of a small number of selected blocks when the data-hold block selection function is used.

In order to achieve the aforementioned objective, according to one aspect of the present invention, there is provided a semiconductor memory device provided with a memory cell array being refreshed in accordance with a refresh timing signal having a predetermined refresh period and generated by a refresh timing signal generator circuit. In the semiconductor memory device, selecting means selects a block to hold data in the memory cell array divided into a plurality of blocks in accordance with a predetermined command signal, and signal generating means changes the refresh period according to a number of blocks selected by the selecting means and generating a refresh timing signal having a changed refresh period, and outputs a generated refresh signal.

In the above-mentioned semiconductor memory device, when the number of blocks selected by the selecting means is a natural number n, and the number of all the blocks of the memory cell array is a natural number m (m>n) equal to or larger than two, then the signal generating means preferably generates a refresh timing signal having a period of m/n times the refresh period when the number of blocks selected by the selecting means is the number of all the blocks of the memory cell array, and outputs a generated refresh timing signal.

In the above-mentioned semiconductor memory device, an address of the block selected by the selecting means preferably has a specific address rule.

According to another aspect of the present invention, there is provided a semiconductor memory device provided with a memory cell array being refreshed in accordance with a refresh timing signal having a predetermined refresh period and generated by a refresh timing signal generator circuit. In the semiconductor memory device, setting means sets whether or not data is held at only a predetermined block in the memory cell array divided into a plurality of blocks, in accordance with a predetermined first command signal, and frequency dividing means divides a frequency of the refresh timing signal by a predetermined frequency division number in accordance with a predetermined second command signal, and outputs a frequency-divided refresh timing signal. Then signal selecting means outputs the frequency-divided refresh timing signal outputted from the frequency dividing means in place of the undivided refresh timing signal, when the setting means performs setting so that data is held at only the predetermined block in the memory cell array.

In the above-mentioned semiconductor memory device, when a number of blocks selected by the selecting means is a natural number n and a number of all the blocks of the memory cell array is a natural number m (m>n) equal to or larger than two, then the frequency division number is preferably set to m/n.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
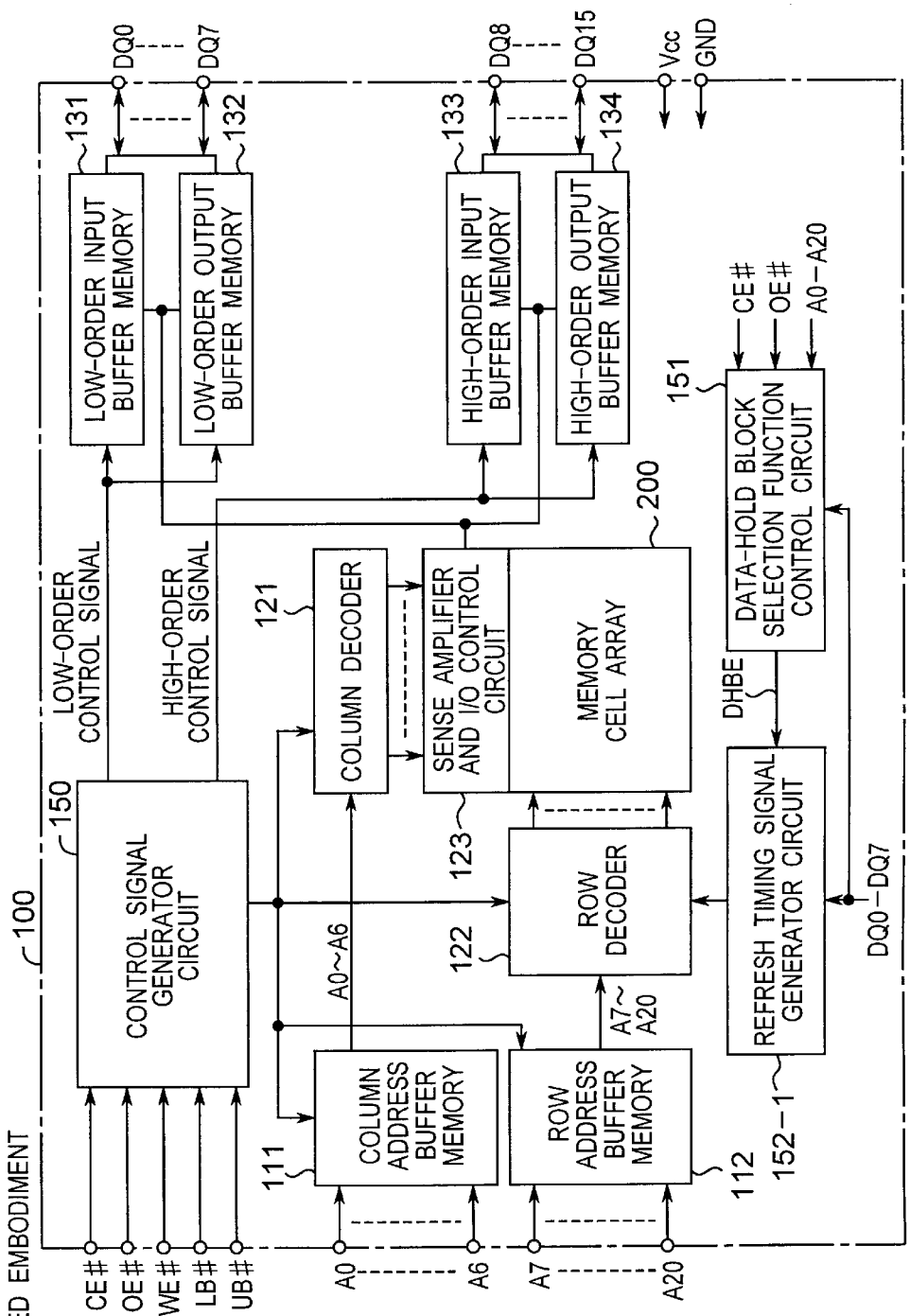
FIG. 1 is a block diagram showing a construction of a semiconductor memory device according to a first preferred embodiment of the present invention.

Preferred embodiments of the present invention will be described below with reference to the drawings. In the figures, same components are denoted by same reference numerals, and no detailed description is provided therefor.

FIRST PREFERRED EMBODIMENT

Figure 2:
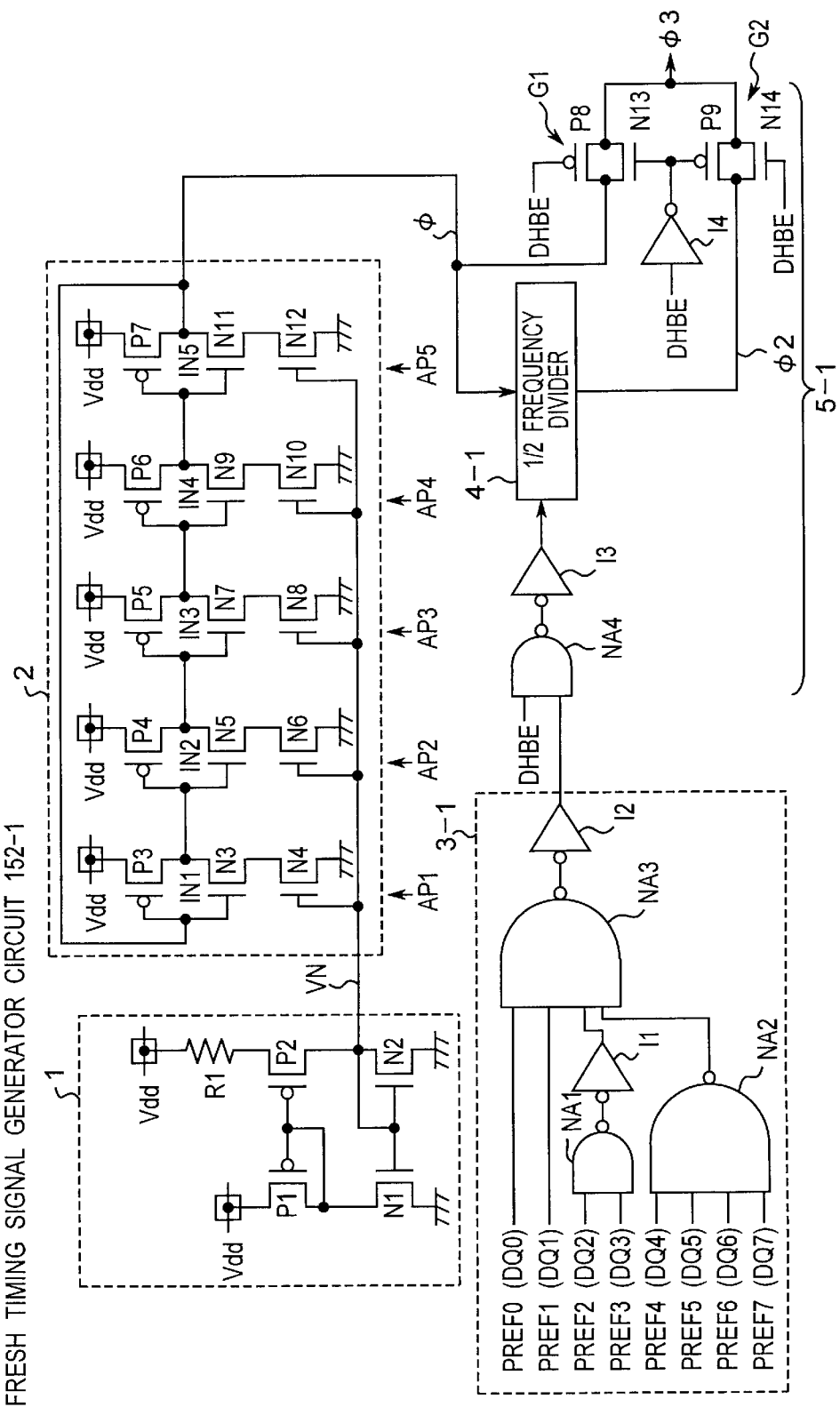
FIG. 2 is a circuit diagram showing a construction of a refresh timing signal generator circuit 152-1 in FIG. 1.

FIG. 1 is a block diagram showing a construction of a semiconductor memory device 100 according to a first preferred embodiment of the present invention, and FIG. 2 is a circuit diagram showing a construction of a refresh timing signal generator circuit 152-1 in FIG. 1.

The semiconductor memory device 100 of FIG. 1 is a so-called "Pseudo SRAM", which has DRAM type memory cells and an input and output interface compatible with the asynchronous type SRAM and is provided with a refresh timing signal generator circuit 152-1 for generating a refresh timing signal. In this case, as shown in FIG. 2, the refresh timing signal generator circuit 152-1 is characterized by including a selected block number detector circuit 3-1, a 1/2 frequency divider 4-1 and a signal selection circuit 5-1 in addition to a reference voltage generator circuit 1 and a ring oscillator 2. Then, in particular, when a data-hold block holding or retaining function is selected with regard to a refresh timing signal $\phi$ having a predetermined refresh period generated by the reference voltage generator circuit 1 and the ring oscillator 2, the refresh period of the refresh timing signal $\phi$ is changed according to the number of selected blocks, and a refresh timing signal $\phi 3$ having the changed refresh period is generated and outputted.

First of all, the construction of the semiconductor memory device 100 will be described with reference to FIG. 1.

Referring to FIG. 1, the semiconductor memory device 100 is provided with a DRAM type memory cell array 200 constructed of a plurality of memory cells. Each memory cell is the DRAM type, and the input and output interface is compatible with that of the asynchronous type SRAM. A plurality of bit lines of the memory cell array 200 is provided with a sense amplifier, an I/O control circuit (Input and Output control circuit) 123 and a column decoder 121, and a plurality of word lines of the memory cell array 200 is provided with a row decoder 122. Address data A0–A6 of the low-order seven bits are inputted to the column decoder 121 via a column address buffer memory 111 and used for controlling the bit lines. Moreover, address data A7–A20 of the high-order 14 bits are inputted to the row decoder 122 via a row address buffer memory 112 and used for controlling the word lines. On the other hand, the data of low-order one byte inputted via data terminals DQ0–DQ7 are written into the memory cells that are in the memory cell array 200 and are connected to the word lines designated by the row decoder 122 via a low-order input buffer memory 131 and a sense amplifier and I/O control circuit 123. Moreover, the data of high-order one byte inputted via data terminals DQ8–DQ15 are written into the memory cells that are in the memory cell array 200 and are connected to the word lines designated by the row decoder 122 via a high-order input buffer memory 133 and a sense amplifier and I/O control circuit 123. Further, the data of low-order one byte from the memory cells that are in the memory cell array 200 and are connected to the word lines designated by the row decoder 122 are read out via the sense amplifier and I/O control circuit 123 and a low-order output buffer memory 132. On the other hand, the data of high-order one byte from the memory cells that are in the memory cell array 200 and are connected to the word lines designated by the row decoder 122 are read out via the sense amplifier and I/O control circuit 123 and a low-order output buffer memory 134.

A control signal generator circuit 150 generates an internal control signal for controlling the write and read-out operations of the memory cell array 200 in accordance with a chip enable signal CE#, an output enable signal OE#, a write enable signal WE#, a low-order byte control signal LB# and a high-order byte control signal UB#, which are external control signals, thereby controlling the operations of the row decoder 122, the column decoder 121, the row address buffer memory 112, the column address buffer memory 111 and the I/O buffer memories 131 to 134. In this case, the mark # given to the tail of each of the symbols of the signals indicates a low enable signal, i.e., a signal for enabling or activating a circuit with the low level (L-level) thereof. That is, the control signal generator circuit 150 generates internal control signals to control the read-out operation of data from the memory cell array 200, the write operation of data into the memory cell array 200 and the refresh operation of the memory cell array 200. Moreover, the memory cell array 200 is subjected to completely hidden refresh, and refresh control with external clock and system is not needed at all.

Moreover, in accordance with the chip enable signal CE#, the output enable signal OE#, the address data A0–A20 and the low-order data of the data terminals DQ0–DQ7 from the external circuit, the data-hold block selection function control circuit 151 determines whether or not to the data-hold block selection function is set. When the data-hold block selection function is set, a data-hold block selection function command signal DHBE is generated and outputted to a refresh timing signal generator circuit 152-1. In concrete, by setting both the chip enable signal CE# and the output enable signal OE# at the L-level, inputting the last address of the memory cell array 200 and executing the read-out operation four times, the system enters a command mode. Next, after the "data-hold block selection function" is designated by inputting the predetermined low-order data via the data terminals DQ0–DQ7, the predetermined low-order data are inputted via the data terminals DQ0–DQ7 to set the block to be selected in the memory cell array 200. Next, in accordance with the data-hold block selection function command signal from the data-hold block selection function control circuit 151 and the data inputted via the data terminal DQ0–DQ7, the refresh timing signal generator circuit 152-1 changes the period of the refresh timing signal, generates a refresh timing signal having a changed period, and outputs the generated refreshed timing signal to the row decoder 122, thereby controlling the refresh operation in the memory cells of the memory cell array 200.

A concrete example of the normal read-out and write operations of the semiconductor memory device 100 constructed as above will be described below.

For reading out data, if the address is designated by the address data A0–A20 by setting the write enable signal WE# at the "H" level and the output enable signal OE# at the "L" level in a state in which the chip enable signal CE# is at the "L" level and both or either one of the low-order byte control signal LB# and the high-order byte control signal UB# is at the "L" level, then the data of the designated address are outputted from the data terminals DQ0–DQ 15. If the read-out operation is executed by setting the low-order byte control signal LB# at the "L" level and the high-order byte control signal UB# at the "H" level, then the read-out data are outputted to the data terminals DQ0–DQ7, and the data terminals DQ8–DQ 15 become a high impedance. If the read-out operation is executed by setting the low-order byte control signal LB# at the "H" level and the high-order byte control signal UB# at the "L" level, then the read-out data are outputted to the data terminals DQ8–DQ 15, and the data terminals DQ0–DQ7 become a high impedance. If the read-out operation is executed by setting both the low-order byte control signal LB# and the high-order byte control signal UB# at the "L" level, then the read-out data are outputted to the data terminals DQ0–DQ15. During the read-out cycle, the address is taken into the memory cell array 200 as occasion demands when the chip enable signal CE#="L" level, and the read-out data are outputted.

For writing data, if the address is designated by the address data A0–A20 by setting the write enable signal WE# at the "L" level in a state in which the chip enable signal CE# is at the "L" level and both or either one of the low-order byte control signal LB# and the high-order byte control signal UB# is at the "L" level, then the data inputted from the data terminals DQ0–DQ 15 are written into the memory cell of the designated address. If the write is executed by setting the low-order byte control signal LB# at the "L" level and the high-order byte control signal UB# at the "H" level, then the data inputted from the data terminals DQ0–DQ7 are written into the memory cell array 200, and the data at the data terminals DQ8–DQ15 are ignored. If the data write operation is executed by setting the low-order byte control signal LB# at the "H" level and the high-order byte control signal UB# at the "L" level, then the data inputted from the data terminals DQ8–DQ15 are written, and the data at the data terminals DQ0–DQ7 are ignored. If the write operation is executed by setting both the low-order byte control signal LB# and the high-order byte control signal UB# at the "L" level, then the data inputted from the data terminals DQ0–DQ15 are written. Further, if the write enable signal WE# is set at the "L" level, and the output enable signal OE# is set at the "L" level, then priority is given to the write operation. It is allowed not to change the address for write for the interval during the write enable signal WE# ="L" level, and to change the address after the write enable signal WE# rises to the H" level.

Next, the construction and the operation of the refresh timing signal generator circuit 152-1 will be described below with reference to FIG. 2.

Figure 6:
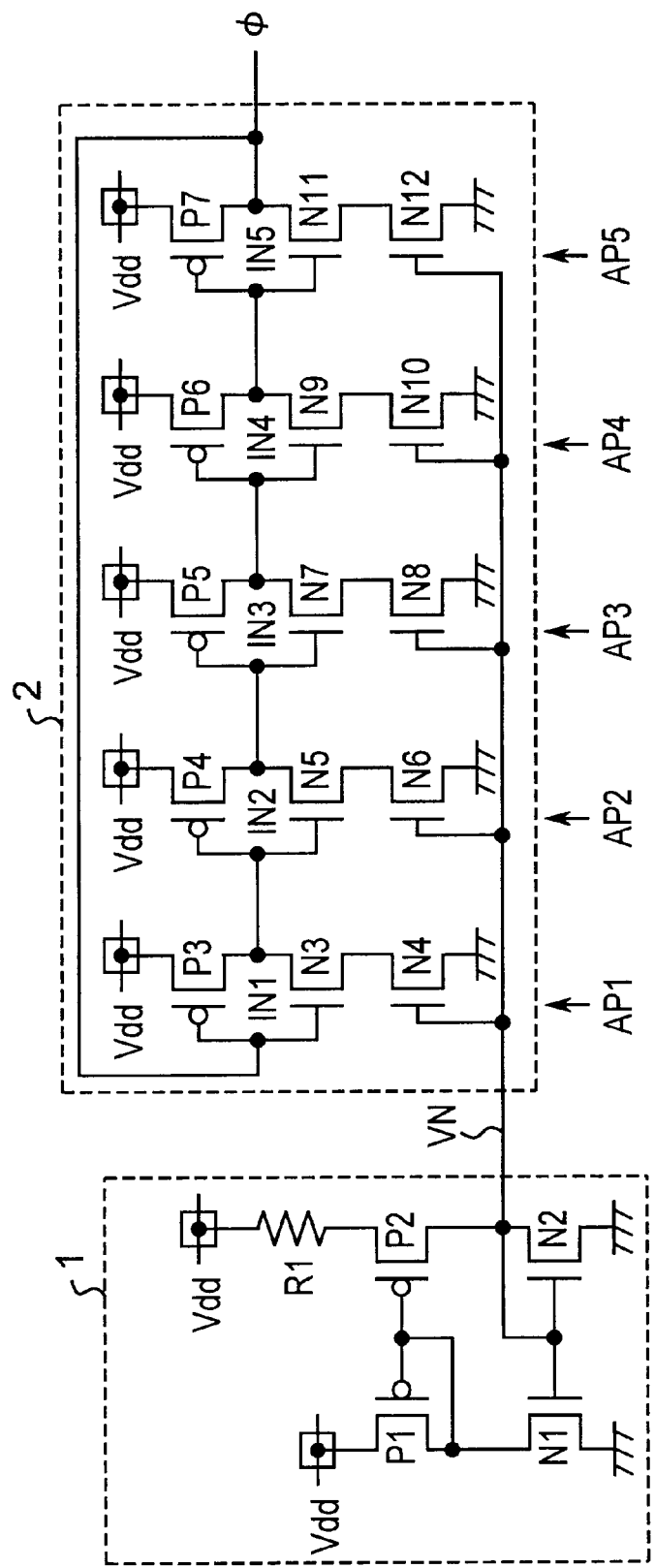
FIG. 6 is a circuit diagram showing a construction of a refresh timing signal generator circuit 152-5 according to a prior art example.

Referring to FIG. 2, the reference voltage generator circuit 1 and the ring oscillator 2 are constructed in a manner similar to that of the respective circuits of the prior art example shown in FIG. 6.

The selected block number detector circuit 3-1 is constructed of three NAND gates NA1 to NA3 and two inverters I1 and I2 and provided for detecting the number of selected blocks. The selected block designation signal is constructed of one byte of PREF0–PREF7, and the selected block designation signal PREF0 inputted via the data terminal DQ0 and the selected block designation signal PREF1 inputted via the data terminal DQ1 are each inputted to the NAND gate NA3. The selected block designation signal PREF2 inputted via the data terminal DQ3 and the selected block designation signal PREF3 inputted via the data terminal DQ3 are each inputted to the NAND gate NA1, and thereafter, an output signal from the NAND gate NA1 is outputted to the NAND gate NA3 via the inverter I1. Further, the selected block designation signal PREF4 inputted via the data terminal DQ4, the selected block designation signal PREF5 inputted via the data terminal DQ5, the selected block designation signal PREF6 inputted via the data terminal DQ6 and the selected block designation signal PREF7 inputted via the data terminal DQ7 are each inputted to the NAND gate NA2, and an output signal from the NAND gate NA2 is outputted to the NAND gate NA3. Then, the NAND gate NA3 executes a NAND operation of the four signals inputted thereto, and therefore, its output signal is outputted to the NAND gate NA4 of the signal selection circuit 5-1 via the inverter I2.

In the signal selection circuit 5-1, the data-hold block selection function command signal DHBE is inputted to the NAND gate NA4. The NAND gate NA4 executes a NAND operation of the two inputted signals, and thereafter, outputs its output signal to the 1/2 frequency divider 4-1 via an inverter I3. In a gate circuit G1 in which the P-channel FET P8 and the N-channel FET N13 have their respective sources and drains connected parallel to each other, the data-hold block selection function command signal DHBE is applied to the gate of the P-channel FET P8, while the data-hold block selection function command signal DHBE is applied to the gate of the N-channel FET N13 via an inverter 14. Moreover, in a gate circuit G2 in which the P-channel FET P9 and the N-channel FET N14 have their respective sources and drains connected parallel to each other, the data-hold block selection function command signal DHBE is applied to the gate of the P-channel FET P9 via the inverter 14, while the data-hold block selection function command signal DHBE is applied to the gate of the N-channel FET N14.

In the signal selection circuit 5-1 constructed as above, when the data-hold block selection function command signal DHBE has the "L" level and the data-hold block selection function is not set, the control signal inputted from the inverter 13 to the 1/2 frequency divider 4-1 has the "L" level. Therefore, the 1/2 frequency divider 4-1 does not operate, as a consequence of which the gate circuit G1 is opened and the gate circuit G2 is closed. Therefore, the refresh timing signal φ from the ring oscillator 2 is outputted intact as a refresh timing signal φ3 without undergoing frequency division. When the data-hold block selection function command signal DHBE has the "H" level and the data-hold block selection function is set by selecting half block in the memory cell array 200, the control signal inputted from the inverter 13 to the 1/2 frequency divider 4-1 has the "H" level. Therefore, the 1/2 frequency divider 4-1 operates, as a consequence of which the refresh timing signal φ from the ring oscillator 2 has its frequency divided by a factor of 2 (i.e., has its period doubled) by the 1/2 frequency divider 4-1 and generates a refresh timing signal φ2 obtained after the 1/2 frequency division. Consequently, the gate circuit G1 becomes closed, and the gate circuit G2 becomes opened. Therefore, the generated refresh timing signal φ2 obtained after the 1/2 frequency division is outputted as the refresh timing signal φ3.

An example of the operation of the refresh timing signal generator circuit 152-1 constructed as above will be described below.

In a manner similar to that of the description of the construction of the prior art example, the oscillation period of the ring oscillator 2 is constant regardless of the operation mode since it is determined by the voltage level of the reference voltage VN and the number of stages (five stages in the construction of FIG. 1) of the inverters that constitute the ring oscillator 2. The reference numerals PREF0–PREF7 inputted to the selected block number detector circuit 3 denote selected block designation signals for designating the selected block. When selecting, for example, a block 0 in the memory cell array 200, the selected block designation signal PREF0 becomes the "H" level. In this preferred embodiment, when half of eight blocks in total, i.e., four blocks of blocks 0–3 are selected, the selected block designation signals PREF0–3 become the "H" level, and the output signal of the inverter 12 becomes the "H" level. When the data-hold block selection function is set, the data-hold block selection function command signal DHBE becomes the "H" level, and therefore, the output signal of the inverter 13 becomes the "H" level to operate the 1/2 frequency divider 4-1. By the operation of the 1/2 frequency divider 4-1, the 1/2 frequency divider 4-1 divides the frequency of the refresh timing signal φ4 from the ring oscillator 2 by a factor of 2 or multiplies the refresh period by two, and then, outputs the refresh timing signal φ2 having the frequency divided by a factor of 2. Further, because of the data-hold block selection function command signal DHBE="H" level, the P-channel FET P9 and the N-channel FET N14 are both turned on, and the P-channel FET P8 and the N-channel FET N13 are both turned off. Consequently, the refresh timing signal φ2 divided by a factor of 2 is transferred and outputted as the refresh timing signal φ3.

As described above, while the data-hold block selection function is used, the refresh period can be made double the normal period when half of the memory cell array 200 is the selected block. Moreover, when the data-hold block selection function is not used, because of the data-hold block selection function command signal DHBE="L" level, the output signal of the inverter 12 becomes the "L" level, and the output signal of the inverter I3 becomes the "L" level. Consequently, the 1/2 frequency divider 4-1 does not operate. Further, the P-channel FET P8 and the N-channel FET N13 are both turned on, and the P-channel FET P9 and the N-channel FET N14 are both turned off. Consequently, the refresh timing signal φ4, which does not undergo frequency division, is outputted as the refresh timing signal φ3. That is, when the data-hold block selection function is used, the refresh period is constant. Since the refresh timing signal generator circuit 152-1 of the present preferred embodiment can change the refresh period according to the number of data-hold blocks, the consumption of power can be reduced by controlling the refresh period such that the refresh period is prolonged when the number of selected blocks is small while the data-hold block selection function is used.

According to the experiments conducted by the present inventor and others, a base consumption current when the memory cell array 200 is not used is 30 μA, and the consumption current when all the blocks are used is 60 μA. Although a consumption current of about 45 μA flows in the prior art example when the blocks are used by one half in a manner similar to that of the present preferred embodiment, the consumption current becomes about 37.5 μA by multiplying the period of the refresh timing signal by 2, and then, this leads to such an advantageous effect that a consumption current of about 7.5 μA can be saved.

In the prior art, the data-hold block selection function has been able to select an arbitrary block. However, to enable the selection of an arbitrary block makes it difficult to adjust the refresh timing signal. Therefore, the refresh timing signal has not been able to be easily adjusted by the prior art technique. However, by selecting the data-hold block according to a specified address rule (e.g., selecting only continuous blocks or selecting only even-number or odd-number blocks), the first preferred embodiment can easily be achieved.

SECOND PREFERRED EMBODIMENT

Figure 3:
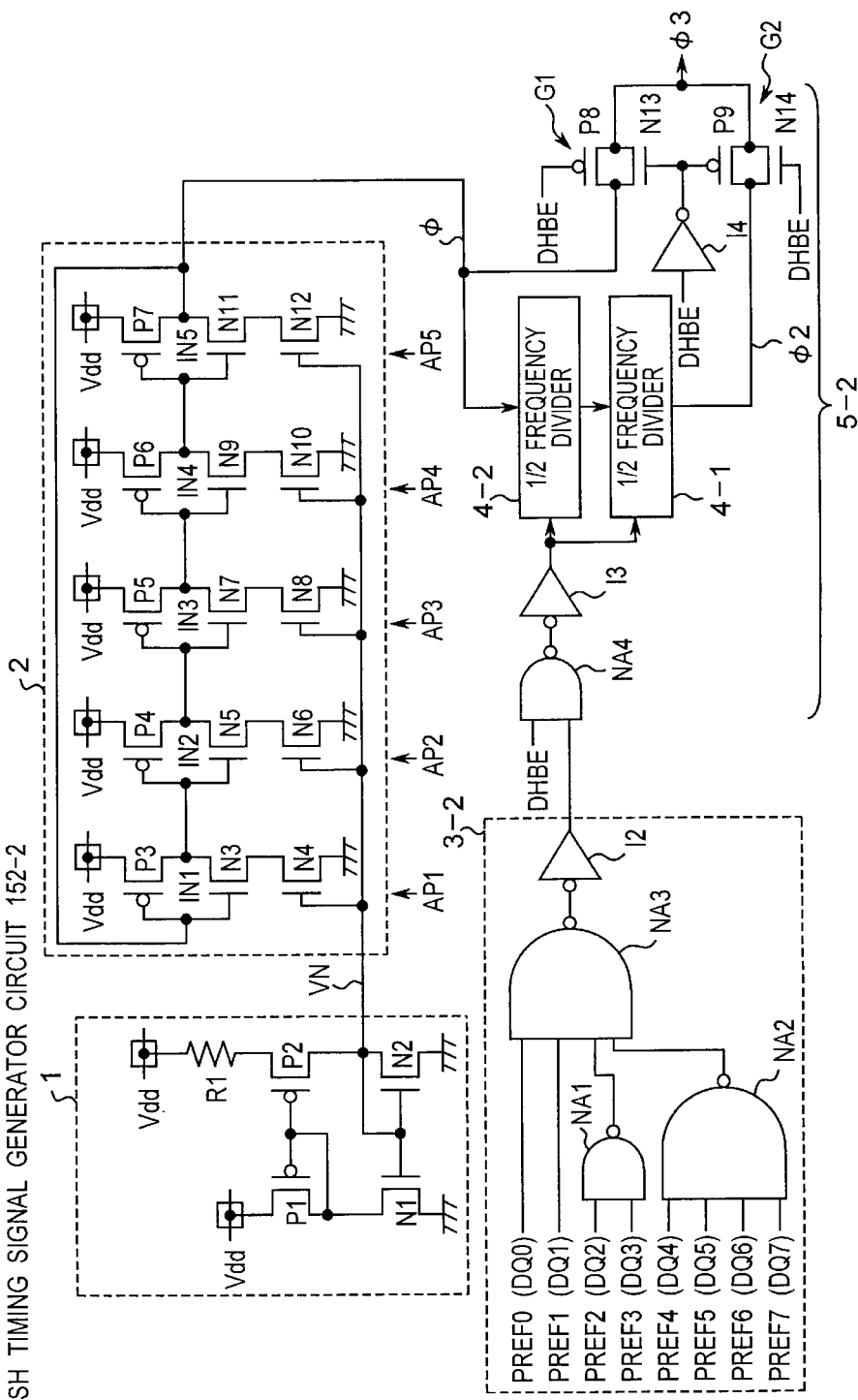
FIG. 3 is a circuit diagram showing a construction of a refresh timing signal generator circuit 152-2 according to a second preferred embodiment of the present invention.

FIG. 3 is a circuit diagram showing a construction of a refresh timing signal generator circuit 152-2 according to a second preferred embodiment of the present invention. The refresh timing signal generator circuit 152-2 of the second preferred embodiment differs from the refresh timing signal generator circuit 152-1 of the first preferred embodiment shown in FIG. 2 at the following points:

(1) In the selected block number detector circuit 3-1, a selected block number detector circuit 3-2 is provided by removing the inverter I1 provided between the output terminal of the NAND gate NA1 and the input terminal of the NAND gate NA3.

(2) In the signal selection circuit 5-1, a 1/4 frequency divider is constructed by connecting two 1/2 frequency dividers 4-1 and 4-2 in series in place of the 1/2 frequency divider 4-1 of one stage.

In the refresh timing signal generator circuit 152-2 constructed as above, if one-fourth of all the eight blocks of the memory cell array 200, i.e., two blocks of blocks 0–1 are selected by the selected block designation signals PREF0–PREF7 inputted to the selected block number detector circuit 3-2, then the selected block designation signals PREF0–1 become the "H" level, and the output signal of the inverter 12 become the "H" level. When the data-hold block selection function is used, the data-hold block selection function command signal DHBE becomes the "H" level. Consequently, the output signal of the inverter 13 becomes the "H" level, and two 1/2 frequency dividers 4-1 and 4-2 operate. By the operation of the two 1/2 frequency dividers 4-1 and 4-2, the refresh timing signal $\phi 2$ from the 1/2 frequency divider 4-1 has an oscillation period of four times the period of the refresh timing signal $\phi$. Further, because of the data-hold block selection function command signal DHBE= "H" level, the P-channel FET P9 and the N-channel FET N14 are both turned on, and the P-channel FET P8 and the N-channel FET N13 are both turned off. Consequently, the refresh timing signal $\phi 2$ is transferred and outputted as the refresh timing signal $\phi 3$. As described above, when the data-hold block selection function is used, the refresh period can be made four times the normal period in the case where the selected blocks are one-fourth of all the blocks of the memory cell array 200.

Since the refresh timing signal generator circuit 152-2 of the present preferred embodiment can change the refresh period according to the number of data-hold blocks, the consumption of power can be reduced by controlling the refresh period such that the refresh period is prolonged when the number of selected blocks is small while the data-hold block selection function is used.

According to the experiments conducted by the present inventor and others, a base consumption current when the memory cell array 200 is not used is 30 $\mu$A, and the consumption current when all the blocks are used is 60 $\mu$A. Although a consumption current of about 37.5 $\mu$A flows in the prior art example when the blocks are used by one-fourth in a manner similar to that of the present preferred embodiment, the consumption current becomes about 33.75 $\mu$A by multiplying the period of the refresh timing signal by four as shown in the present preferred embodiment, and this leads to such an advantageous effect that a consumption current of about 3.75 $\mu$A can be saved.

THIRD PREFERRED EMBODIMENT

Figure 4:
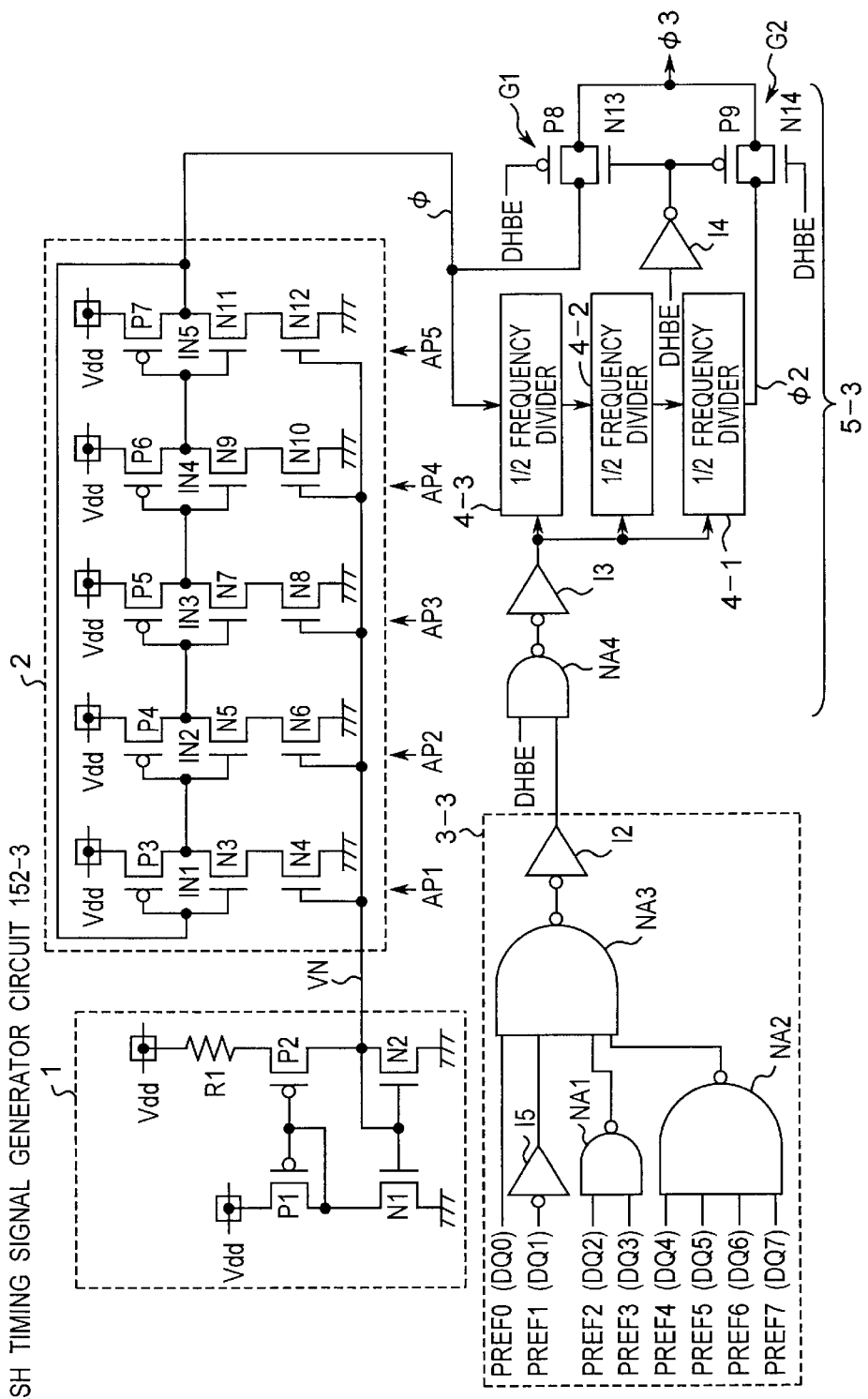
FIG. 4 is a circuit diagram showing a construction of a refresh timing signal generator circuit 152-3 according to a third preferred embodiment of the present invention.

FIG. 4 is a circuit diagram showing a construction of a refresh timing signal generator circuit 152-3 according to a third preferred embodiment of the present invention. The refresh timing signal generator circuit 152-3 of the third preferred embodiment differs from the refresh timing signal generator circuit 152-2 of the second preferred embodiment shown in FIG. 3 at the following points.

(1) In the selected block number detector circuit 3-2, a selected block number detector circuit 3-3 is provided by inputting the selected block designation signal PREF1 to the NAND gate NA3 via an inverter 15.

(2) In the signal selection circuit 5-2, a 1/8 frequency divider is constructed by connecting three 1/2 frequency dividers 4-1, 4-2 and 4-3 in series in place of the 1/2 frequency dividers 4-1 and 4-2 of two stages.

In the refresh timing signal generator circuit 152-3 constructed as above, if one-eighth of all the eight blocks of the memory cell array 200, i.e., one block of the block 0 is selected by the selected block designation signals PREF0–PREF7 inputted to the selected block number detector circuit 3-3, then the selected block designation signal PREF0 becomes the "H" level, and the output signal of the inverter 12 becomes the "H" level. When the data-hold block selection function is used, the data-hold block selection function command signal DHBE becomes the "H" level. Consequently, the output signal of the inverter 13 becomes the "H" level, and three 1/2 frequency dividers 4-1, 4-2 and 4-3 operate. By the operation of the three 1/2 frequency dividers 4-1, 4-2 and 4-3, the refresh timing signal $\phi 2$ outputted from the 1/2 frequency divider 4-1 have an oscillation period of the eight times the period of the refresh timing signal $\phi 4$. Further, because of the data-hold block selection function command signal DHBE ="H" level, the P-channel FET P9 and the N-channel FET N14 are both turned on, and the P-channel FET P8 and the N-channel FET N13 are both turned off. Consequently, the refresh timing signal $\phi 2$ divided by a factor of 8 is transferred and outputted as the refresh timing signal $\phi 3$. As described above, when the data-hold block selection function is used, the refresh period can be made eight times the normal period in the case where the selected blocks are one-eighth of all the blocks.

Since the refresh timing signal generator circuit 152-3 of the present preferred embodiment can change the refresh period according to the number of data-hold blocks, the consumption of power can be reduced by controlling the refresh period such that the refresh period is prolonged when the number of selected blocks is small while the data-hold block selection function is used.

According to the experiments conducted by the present inventor and others, a base consumption current when the memory cell array 200 is not used is 30 $\mu$A, and the consumption current when all the blocks are used is 60 $\mu$A. Although a consumption current of about 33.75 $\mu$A flows in the prior art example when the blocks are used by one-eighth in a manner similar to that of the present preferred embodiment, the consumption current becomes about 31.88 $\mu$A by multiplying the refresh period of the refresh timing signal by eight as shown in the present preferred embodiment, and this leads to such an advantageous effect that a consumption current of about 1.88 $\mu$A can be saved.

FOURTH PREFERRED EMBODIMENT

Figure 5:
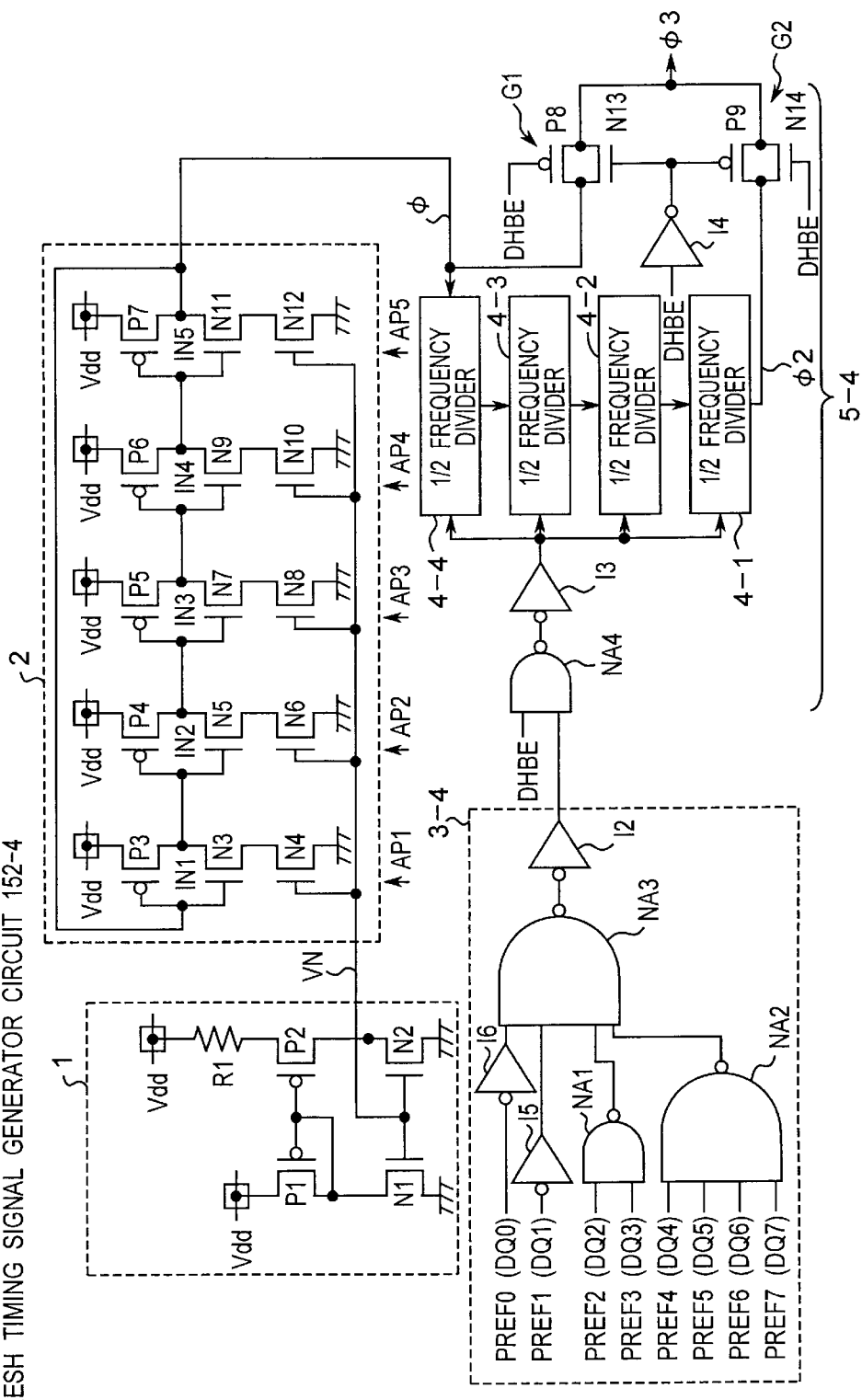
FIG. 5 is a circuit diagram showing a construction of a refresh timing signal generator circuit 152-4 according to a fourth preferred embodiment of the present invention.

FIG. 5 is a circuit diagram showing a construction of a refresh timing signal generator circuit 152-4 according to a fourth preferred embodiment of the present invention. The refresh timing signal generator circuit 152-4 of the fourth preferred embodiment differs from the refresh timing signal generator circuits 152-3 of the third preferred embodiment shown in FIG. 4 at the following points.

(1) In the selected block number detector circuit 3-3, a selected block number detector circuit 3-4 is provided by inputting the selected block designation signal PREFO to the NAND gate NA3 via an inverter 16.

(2) In the signal selection circuit 5-3, a 1/16 frequency divider is constructed by connecting four 1/2 frequency dividers 4-1, 4-2, 4-3 and 4-4 in series in place of the 1/2 frequency dividers 4-1, 4-2 and 4-3 of three stages, for the provision of a signal selection circuit 5-4.

In the refresh timing signal generator circuit 152-4 constructed as above, if one-sixteenth of all the eight blocks of the memory cell array 200 is selected by the selected block designation signals PREF0–PREF7 inputted to the selected block number detector circuit 3-4, then the four 1/2 frequency dividers 4-1, 4-2, 4-3 and 4-4 operate in a manner similar to that of the aforementioned case, as a consequence of which the refresh timing signal $\phi 2$ outputted from the 1/2 frequency divider 4-1 have an oscillation period of the sixteen times the refresh period of the original refresh timing signal $\phi$.

Since the refresh timing signal generator circuit 152-4 of the present preferred embodiment can change the refresh period according to the number of data-hold blocks, the consumption of power can be reduced by controlling the refresh period such that the refresh period is prolonged when the number of selected blocks is small while the data-hold block selection function is used.

According to the experiments conducted by the present inventor and others, a base consumption current when the memory cell array 200 is not used is 30 $\mu A$, and the consumption current when all the blocks are used is 60 $\mu A$. Although a consumption current of about 31.88 $\mu A$ flows in the prior art example when the blocks are used by one-sixteenth in a manner similar to that of the present preferred embodiment, the consumption current becomes about 0.94 $\mu A$ by multiplying the period of the refresh timing signal by 16 as shown in the present preferred embodiment, and this leads to such an advantageous effect that a consumption current of about 0.94 $\mu A$ can be saved.

The frequency division number accomplished by one or a plurality of 1/2 frequency dividers is set to 2, 4, 8 and 16 in the aforementioned preferred embodiments. However, the present invention is not limited to this, and the frequency division number may be an integer equal to or larger than two. When the number of selected blocks is set to a natural number n and the number of all the blocks is a natural number m (m>n) equal to or larger than two, then the frequency division number may be a number m/n by combining the frequency dividers with one another.

ADVANTAGEOUS EFFECTS OF PREFERRED EMBODIMENTS

As described in detail above, according to one aspect of the semiconductor memory device of the present invention, there is provided a semiconductor memory device provided with a memory cell array being refreshed in accordance with a refresh timing signal having a predetermined refresh period and generated by a refresh timing signal generator circuit. In the semiconductor memory device, selecting means selects a block to hold data in the memory cell array divided into a plurality of blocks in accordance with a predetermined command signal, and signal generating means changes the refresh period according to a number of blocks selected by the selecting means and generating a refresh timing signal having a changed refresh period, and outputs a generated refresh signal. Accordingly, the consumption of power can be reduced by control such that the refresh period is prolonged when the number of selected blocks is small while the data-hold block selection function is used.

In the above-mentioned semiconductor memory device, when the number of blocks selected by the selecting means is a natural number n, and the number of all the blocks of the memory cell array is a natural number m (m>n) equal to or larger than two, then the signal generating means preferably generates a refresh timing signal having a period of m/n times the refresh period when the number of blocks selected by the selecting means is the number of all the blocks of the memory cell array, and outputs a generated refresh timing signal. Accordingly, the consumption of power can be reduced by controlling the refresh period such that the refresh period is prolonged by m/n times while the data-hold block selection function is used.

Moreover, in the above-mentioned semiconductor memory device, an address of the block selected by the selecting means preferably has a specific address rule. Accordingly, due to the provision of the specific address rule, the refresh timing signal can be easily set.

According to another aspect of the present invention, there is provided a semiconductor memory device provided with a memory cell array being refreshed in accordance with a refresh timing signal having a predetermined refresh period and generated by a refresh timing signal generator circuit. In the semiconductor memory device, setting means sets whether or not data is held at only a predetermined block in the memory cell array divided into a plurality of blocks, in accordance with a predetermined first command signal, and frequency dividing means divides a frequency of the refresh timing signal by a predetermined frequency division number in accordance with a predetermined second command signal, and outputs a frequency-divided refresh timing signal. Then signal selecting means outputs the frequency-divided refresh timing signal outputted from the frequency dividing means in place of the undivided refresh timing signal, when the setting means performs setting so that data is held at only the predetermined block in the memory cell array. Accordingly, the consumption of power can be reduced by controlling the refresh period such that the refresh period is prolonged when the number of selected blocks is small while the data-hold block selection function is used.

In the above-mentioned semiconductor memory device, when a number of blocks selected by the selecting means is a natural number n and a number of all the blocks of the memory cell array is a natural number m (m>n) equal to or larger than two, then the frequency division number is preferably set to m/n. Accordingly, the consumption of power can be reduced by controlling the refresh period such that the refresh period is prolonged by m/n times while the data-hold block selection function is used.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device comprising:

a memory cell array being refreshed in accordance with a refresh timing signal having a predetermined refresh period and generated by a refresh timing signal generator circuit;

selecting means for selecting a block to hold data in the memory cell array divided into a plurality of blocks in accordance with a predetermined command signal; and signal generating means for changing the refresh period according to a number of blocks selected by said selecting means and generating a refresh timing signal having a changed refresh period, and outputting a generated refresh signal.

2. The semiconductor memory device according to claim 1,
wherein, when the number of blocks selected by said selecting means is a natural number n, and the number of all the blocks of said memory cell array is a natural number m (m>n) equal to or larger than two, then said signal generating means generates a refresh timing signal having a period of m/n times the refresh period when the number of blocks selected by said selecting means is the number of all the blocks of said memory cell array, and outputs a generated refresh timing signal.

3. The semiconductor memory device according to claim 2,
wherein an address of the block selected by the selecting means has a specific address rule.

4. A semiconductor memory device comprising:
a memory cell array being refreshed in accordance with a refresh timing signal having a predetermined refresh period and generated by a refresh timing signal generator circuit;
setting means for setting whether or not data is held at only a predetermined block in the memory cell array divided into a plurality of blocks, in accordance with a predetermined first command signal;
frequency dividing means for dividing a frequency of the refresh timing signal by a predetermined frequency division number in accordance with a predetermined second command signal, and outputting a frequency-divided refresh timing signal; and
signal selecting means for outputting the frequency-divided refresh timing signal outputted from said frequency dividing means in place of the undivided refresh timing signal, when said setting means performs setting so that data is held at only the predetermined block in said memory cell array.

5. The semiconductor memory device according to claim 4,
wherein, when a number of blocks selected by said selecting means is a natural number n and a number of all the blocks of the memory cell array is a natural number m (m>n) equal to or larger than two, then the frequency division number is set to m/n.

* * * * *